United States Patent [19]

Takezono et al.

[11] 4,089,063
[45] May 9, 1978

[54] MEMORY APPARATUS WITH DEFECTIVE MODULES

[75] Inventors: Takashi Takezono, Kawasaki; Takashi Kanie, Tama, both of Japan

[73] Assignee: Fujitsu Limited, Kawasaki, Japan

[21] Appl. No.: 785,825

[22] Filed: Apr. 8, 1977

[30] Foreign Application Priority Data

Apr. 12, 1976 Japan .................................. 51-41454

[51] Int. Cl.² ........................ G11C 29/00; G11C 8/00
[52] U.S. Cl. ..................................... 365/200; 364/200
[58] Field of Search .......... 340/173 BB; 235/153 AM

[56] References Cited

U.S. PATENT DOCUMENTS

| | | | |
|---|---|---|---|
| 3,995,261 | 11/1976 | Goldberg | 340/173 BB |
| 4,019,033 | 4/1977 | Parmet | 340/173 BB |
| 4,047,163 | 9/1977 | Choate et al. | 340/173 BB |

Primary Examiner—Stuart N. Hecker
Attorney, Agent, or Firm—Daniel Jay Tick

[57] ABSTRACT

A module array has a plurality of memory modules, each having at least one memory cell, arranged in a matrix of $m$ rows and $n$ columns. An address input provides row addresses for each column of the array from outside the memory apparatus. Address modification devices for each column of the module array modify the row addresses provided for each column of the array to provide new addresses. Address decoders in the array are connected to the address modification devices for selecting the modules of each column of the array, one by one, in accordance with the new addresses. A module state indicator in the array is connected to the address decoders and has memories of at least one bit corresponding to each module of all the rows and all the columns of the array, except one border column for indicating the good or defective condition of each module when accessed at the time the module is accessed. A module selector is connected to the module state indicator and to the array for selecting only a specified number of good modules from $n$ modules accessed simultaneously according to the indication of the module state indicator. Input-output devices are connected by the module selector to the good modules selected by the module selector.

8 Claims, 17 Drawing Figures

FIG. 3A

ROW SELECTION ADDRESS 15 / ADDRESS MODIFICATION INFORMATION 16

| | 000 | 000 | 000 | 000 | 000 | 000 | 000 | 000 | 000 | 000 |
|---|---|---|---|---|---|---|---|---|---|---|
| 0 0 0 | 1 | 1 | 1 | 1 | 1 | 1 | 1 | 1 | 1 | 1 |
| 0 0 1 | 1 | 1 | 1 | 1 | 1 | 1 | 0 | 0 | 0 | 0 |
| 0 1 0 | 0 | 0 | 0 | 0 | 0 | 0 | 0 | 0 | 0 | 0 |
| 0 1 1 | 0 | 0 | 0 | 0 | 0 | 0 | 0 | 0 | 0 | 0 |
| 1 0 0 | 0 | 0 | 0 | 0 | 0 | 0 | 0 | 0 | 0 | 0 |
| 1 0 1 | 0 | 0 | 0 | 0 | 0 | 0 | 0 | 0 | 0 | 0 |
| 1 1 0 | 0 | 0 | 0 | 0 | 0 | 0 | 0 | 0 | 0 | 0 |
| 1 1 1 | 0 | 0 | 0 | 0 | 0 | 0 | 0 | 0 | 0 | 0 |

FIG. 3B

ROW SELECTION ADDRESS 15 / ADDRESS MODIFICATION INFORMATION 16

| | 000 | 000 | 010 | 010 | 100 | 100 | 110 | 110 | 111 | 111 |
|---|---|---|---|---|---|---|---|---|---|---|
| 0 0 0 | 1 | 1 | 0 | 0 | 0 | 0 | 0 | 0 | 0 | 0 |
| 0 0 1 | 1 | 1 | 0 | 0 | 0 | 0 | 0 | 0 | 0 | 0 |
| 0 1 0 | 0 | 0 | 1 | 1 | 0 | 0 | 0 | 0 | 0 | 0 |
| 0 1 1 | 0 | 0 | 1 | 1 | 0 | 0 | 0 | 0 | 0 | 0 |
| 1 0 0 | 0 | 0 | 0 | 0 | 1 | 1 | 0 | 0 | 0 | 0 |
| 1 0 1 | 0 | 0 | 0 | 0 | 1 | 1 | 0 | 0 | 0 | 0 |
| 1 1 0 | 0 | 0 | 0 | 0 | 0 | 0 | 1 | 1 | 0 | 0 |
| 1 1 1 | 0 | 0 | 0 | 0 | 0 | 0 | 0 | 0 | 1 | 1 |

FIG.4A

ADDRESS MODIFICATION INFORMATION 16

ROW SELECTION ADDRESS 15

| | 000 | 000 | 000 | 000 | 000 | 000 | 000 | 000 | 000 | 000 |
|---|---|---|---|---|---|---|---|---|---|---|
| 0 0 0 | 1 | 1 | 1 | 0 | 0 | 0 | 0 | 0 | 0 | 1 |
| 0 0 1 | 0 | 0 | 0 | 1 | 0 | 0 | 0 | 0 | 0 | 1 |
| 0 1 0 | 0 | 0 | 0 | 0 | 0 | 0 | 0 | 0 | 0 | 0 |
| 0 1 1 | 0 | 0 | 0 | 0 | 0 | 0 | 0 | 0 | 0 | 0 |
| 1 0 0 | 0 | 1 | 0 | 0 | 0 | 0 | 0 | 0 | 1 | 0 |
| 1 0 1 | 0 | 0 | 0 | 0 | 0 | 0 | 0 | 0 | 0 | 0 |
| 1 1 0 | 0 | 0 | 0 | 1 | 1 | 0 | 0 | 0 | 0 | 1 |
| 1 1 1 | 1 | 1 | 1 | 0 | 0 | 0 | 0 | 1 | 0 | 1 |

FIG.4B

ADDRESS MODIFICATION INFORMATION 16

ROW SELECTION ADDRESS 15

| | 001 | 010 | 011 | 001 | 110 | 000 | 000 | 000 | 101 | 010 |
|---|---|---|---|---|---|---|---|---|---|---|
| 0 0 0 | 0 | 0 | 0 | 1 | 1 | 0 | 0 | 0 | 0 | 0 |
| 0 0 1 | 1 | 0 | 0 | 0 | 0 | 0 | 0 | 0 | 1 | 0 |
| 0 1 0 | 0 | 1 | 0 | 0 | 0 | 0 | 0 | 0 | 0 | 1 |
| 0 1 1 | 0 | 0 | 1 | 0 | 0 | 0 | 0 | 0 | 0 | 1 |
| 1 0 0 | 0 | 0 | 1 | 0 | 0 | 0 | 0 | 0 | 0 | 1 |
| 1 0 1 | 0 | 1 | 0 | 0 | 0 | 0 | 0 | 0 | 0 | 1 |
| 1 1 0 | 1 | 1 | 0 | 0 | 0 | 0 | 0 | 0 | 0 | 0 |
| 1 1 1 | 0 | 0 | 0 | 1 | 0 | 0 | 0 | 1 | 0 | 0 |

ADDER CIRCUIT
FIG. 7
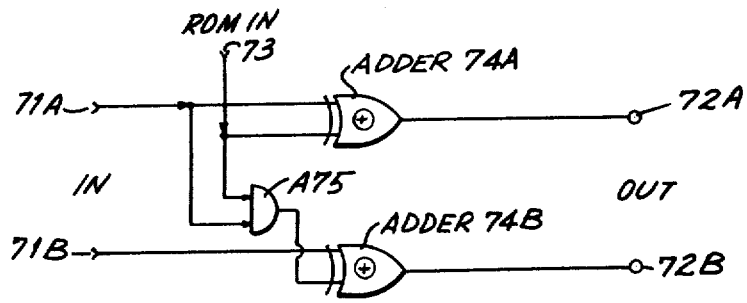
DEMULTIPLEXER CIRCUIT
FIG. 8
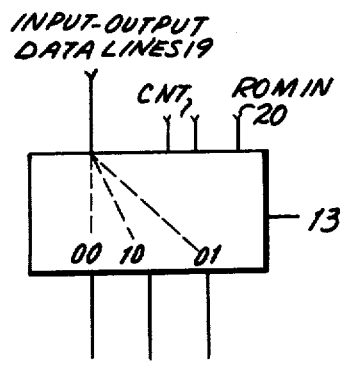
FIG. 9

α MULTIPLIER CIRCUIT

DEMULTIPLEXER CIRCUIT

DEMULTIPLEXER CIRCUIT

4,089,063

MEMORY APPARATUS WITH DEFECTIVE MODULES

BACKGROUND OF THE INVENTION

The present invention relates to memory apparatus. More particularly, the invention relates to memory apparatus which operates normally through a changeover to a previously prepared auxiliary memory module even when a plurality of the memory modules of the apparatus partly become defective.

Recent developments in semiconductor technology have been phenomenal. A computer memory is substantially transferable to an Integrated Circuit or IC memory. Wafer memories are presently being discussed.

The most interesting problem in realizing a wafer memory is how to improve the yield in manufacture. When the memory module chips are cut out from a wafer by the conventional method, a system may readily be developed for mounting only the good modules cut out, and providing such modules on the printed circuit board, even if there are several defective modules on one wafer. On the other hand, when a system is provided for only a single wafer, all the memory modules on the wafer generally have to be good modules. However, this is almost impossible even in the current semiconductor technology. Thus, various methods have been considered for performing the same procedures on the wafer as the cutting out of the good module chips by the present method.

An example of a present method is discretionary wiring. In this method, in principle, an additional number of memory modules, as much as the expected defective memory modules, are prepared previously and only the good memory modules are wired after the test for each memory module. In this method, a desired module may be removed. This is not so practical, however, because of the increase in wiring procedures, the necessity for an exclusive wiring mask for each wafer, the complications of producing a mask on the basis of a test or result, and the resultant increase in the manufacturing cost.

It is also possible to partly simplify the wiring by previously partly preparing the wiring and providing partial wiring in accordance with test results. In this case, however, it becomes generally impossible to select a desired module. This results in the degradation of module application efficiency,. There is thus very little contribution to an improvement in the yield of manufacture.

On the other hand, various other methods are proposed wherein a memory device is provided for indicating a defective module by some method and electrical switching circuit. The defective module is then changed to a good module. If, for example, there is a module group arranged in the form of matrix and the group includes defective modules, the row address, including a defective module, is memorized. If access is made to this address from outside, it is detected and switching is provided to an auxiliary module row. This method is well known, as is the discretionary wiring method, hereinbefore mentioned. There is also a method in which switching is made to the column direction.

The last two methods require a memory for indicating addresses, and generally the access time of the memory is often added to that of the module itself. Furthermore, in such case, switching is provided in a unit of a row or column and, as a result, the module application efficiency is not good. There is thus very little contribution to an improvement in the yield of manufacture. On the other hand, when the unit of switching is made small, the application efficiency is naturally improved. On the other hand, however, the switching circuit is complicated and many circuits are required. Furthermore, yielding and reliability of the switching circuit itself become a problem and, in addition, a large capacity memory is required for storing defective addresses. Therefore, this method is not very practical.

The principal object of the invention is to provide memory apparatus which solves the problems of the known methods and apparatus.

An object of the invention is to provide memory apparatus which switches any desired defective module to almost any desired auxiliary module.

Another object of the invention is to provide memory apparatus in which switching control is accomplished with simple one bit information indicating whether each module is good or defective.

Still another object of the invention is to provide memory apparatus in which switching is realized only by adding a short period to the access time of the module itself.

Yet another object of the invention is to provide memory apparatus in which switching of a defective module is provided from outside the array without the need for a special circuit in the module array.

Another object of the invention is to provide memory apparatus in which an integrated circuit is introduced with facility and with a small amount of hardware.

Still another object of the invention is to provide memory apparatus in which all the modules, including the auxiliary modules, may be checked from the outside without considerable influence of the yield and reliability of the switching circuit on the yield and reliability of the entire system and without any particular need for a test pad and test circuit.

Yet another object of the invention is to provide memory apparatus in which switching between desired modules is provided only by using as many auxiliary modules as the expected defective modules.

Another object of the invention is to provide memory apparatus of simple structure which is efficient, effective and reliable in operation.

BRIEF SUMMARY OF THE INVENTION

In accordance with the invention, memory apparatus comprises a module array having a plurality of memory modules, each having at least one memory cell, arranged in a matrix of $m$ rows and $n$ columns. An address input provides row addresses for each column of the array from outside the memory apparatus. Address modification devices for each column of the module array modify the row addresses provided for each column of the array to provide new addresses. Address decoders in the array are connected to the address modification devices for selecting the modules of each column of the array, one by one, in accordance with the new addresses. A module state indicator means in the array is connected to the address decoders and has memories of at least one bit corresponding to each module of all the rows and all the columns of the array, except one border column, for indicating the good or defective condition of each module when accessed at the time the module is accessed. A module selector is connected to the module state indicator and to the array for selecting only a specified number of good modules from $n$ modules accessed simultaneously according to the indication of the module state indicator. Input-output devices are connected by the module selector to the good modules selected by the module selector.

The module selector comprises $\alpha$ multiplier circuits connected in series with each other and connected to the module state indicator or each column of the array for providing for each column of the array an output directly corresponding to a Galois field element $\alpha^i$ supplied from the next-preceding stage when the indication of the module state indicator is for a good module and an output corresponding to a Galois field element $\alpha^{i+1}$ when the indication of the module state indicator is for a defective module, and demultiplexer circuits connected to each column of the array and to the $\alpha$ multiplier circuits for controlling the connection of an accessed module in a column of the array to the input-output means in accordance with the output of the $\alpha$ multiplier circuits corresponding to the column and indication of the module state indicator.

In another embodiment, the module selector comprises adder circuits connected in series with each other and connected to the module state indicator of each column of the array for providing for each column of the array and an output directly corresponding to the binary value applied from the next-preceding stage when the indication of the module state indicator is for a good module and an output corresponding to the binary value plus +1 when the indication of the module state indicator is for a defective module. Demultiplexer circuits are connected to each column of the array and to the adder circuits for controlling the connection of an accessed module in a column of the array to the input-output devices in accordance with the output of the adder circuits corresponding to the column and indication of the module state indicator.

The module array is provided on a sheet of a semiconductor wafer.

A plurality of read only memory lines are provided. Each of the memory lines has an input end with a read only memory write terminal connected thereto and an output end connected to the module selector, and connected to the module state indicator of a corresponding one of the columns of the array.

A control controls the module selector to select good modules in accordance with a selected part of each memory module. The selected part of each memory module controlled by the control is either the whole module or a fraction of the module.

BRIEF DESCRIPTION OF THE DRAWINGS

In order that the invention may be readily carried into effect, it will now be described with reference to the accompanying drawings, wherein:

FIGS. 3A and 3B are tables showing the distribution of defective modules;

FIGS. 4A and 4B are additional tables showing the distribution of defective modules;

FIG. 7 is a block diagram of an embodiment of the adder circuit of the memory apparatus of the invention;

FIG. 8 is a symbolic representation of the demultiplexer of the memory apparatus of the invention;

FIG. 9 is a connecting block diagram of the adder circuit of the memory apparatus of the invention;

In the FIGS., the same components are identified by the same reference numerals.

DETAILED DESCRIPTION OF THE INVENTION

Figure 1:
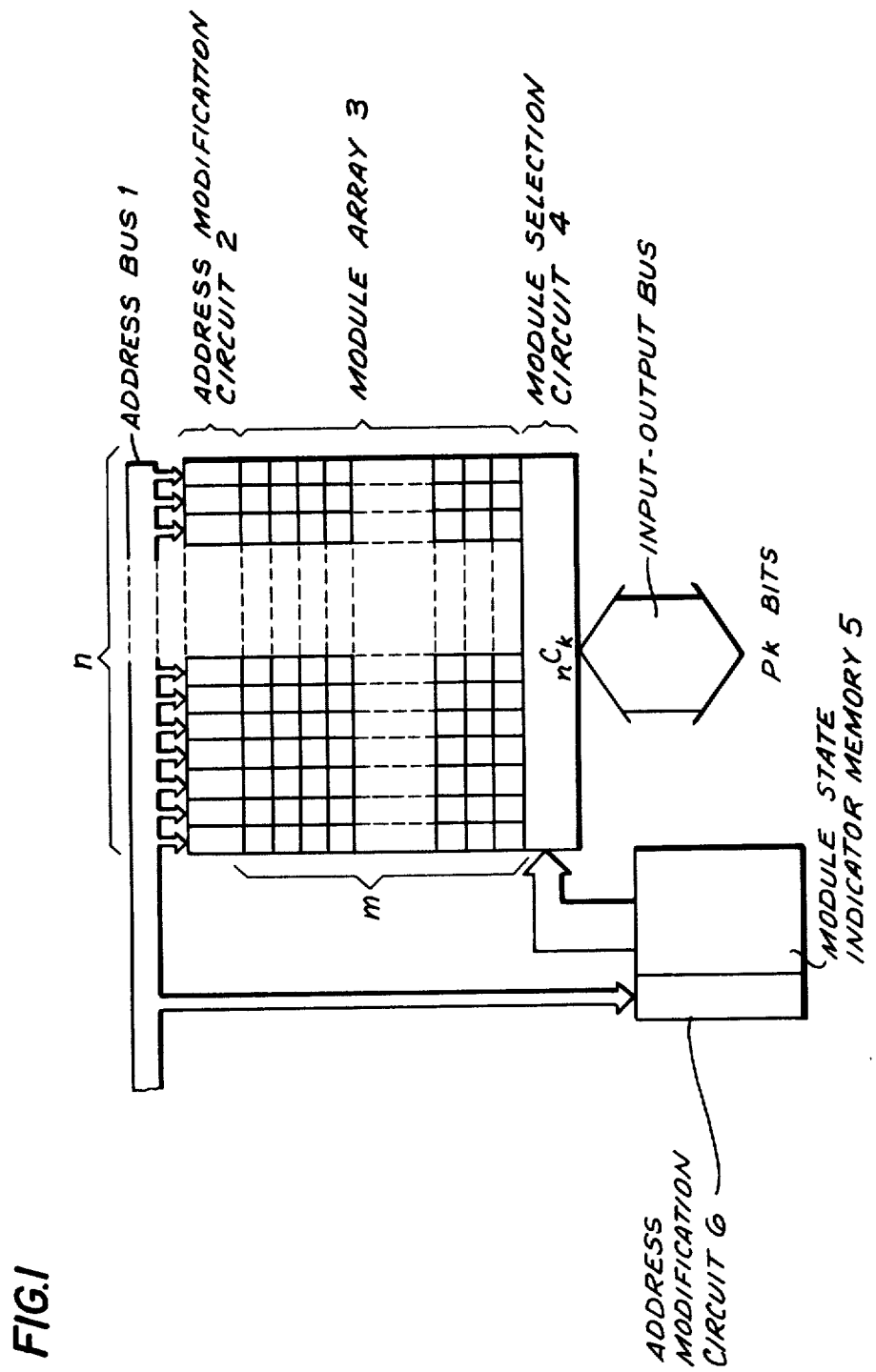
FIG. 1 is a block diagram of an embodiment of the memory apparatus of the invention.

FIG. 1 is an embodiment of the memory apparatus of the invention. In FIG. 1, an address bus 1 supplies the address for selecting one module of $m$ modules forming each module column. The memory apparatus of the invention includes an address modification circuit 2, a module array 3 having $m$ rows and $n$ columns and a module selection circuit 4, which functions to select $k$ modules from $n$ modules. The memory apparatus of the invention further comprises a module state indicator memory 5, an address modification circuit 6 for said indicator memory and an input-output bus of Pk bits The module array 3 is formed by arranging the modules in $m$ rows and $n$ columns. Some of the modules of the module array 3 are defective. A module is assumed to have a configuration of $p$ bits $\times$ $q$ words, respectively. In a rare case, however, a module may have a configuration of only one bit. In order to select one module from the $m$ modules forming each module column, an address is provided in common to the address modification circuit of each column via the address bus 1. The information of the address bus 1 is modified by the address modification circuit 2 provided for each column of the module array and is distributed to each said column. A total of $n$ modules are then selected, one by one, from each column, by means of the modified address information.

The information of the address bus 1 is also supplied to the module state indicator memory 5 in parallel with the abovementioned operation. When access is made to the module state indicator memory 5 via the address modification circuit 6, information indicating which of the $n$ modules then selected is good or defective is read out and then input to the module selecton circuit 4. The module selection circuit 4 is a $k$ out of $n$ selection circuit, where k is defined as $l/P$ when the number of data bits required is considered to be $l$. The module selection circuit 4, which has obtained the information of good or defective for each of $n$ modules, connects $k$ good modules of each column of $n$ modules to the input-output bus 7, and does not connect the defective modules.

The address modification circuit 2 and the address modification circuit 6 perform the same modification, respectively.

In an existing system, even when the total number of defective modules in the $m \times n$ module array is less than $(n - k) \times m$, $k$ good modules required for a row cannot be obtained if the number of defective modules of such row exceeds $n - k$.

Even in such a case, in the present invention, the address modification is carried out by the address modification circuit 2 so that the defective modules included in the selected $n$ modules are less than $(n - k)$ in number. As hereinbefore mentioned, when the address is modified so that the defective modules included in $n$ modules of each row selected simultaneously are less than $(n - k)$ in number, the module selection circuit 4 selects $k$ good modules from $n$ modules on the basis of the good and defective module signals provided the indicator memory 5. The address modification circuit 2 is a generally simple circuit and its influence on the access time is drastically reduced as compared with the existing row switching system.

Since the switching of a defective module is possible until almost all the spare modules are used completely, it is enough for the spare memory modules to prepare them in a number corresponding to the yield calculated in relation with an individual module. The application efficiency is thereby improved, and the yield is simultaneously much improved. The address modification circuit 6 of the module state indicator memory 5 may be provided as required, and, in some cases, it may be omitted, as in the case hereinafter described.

Figure 2A:
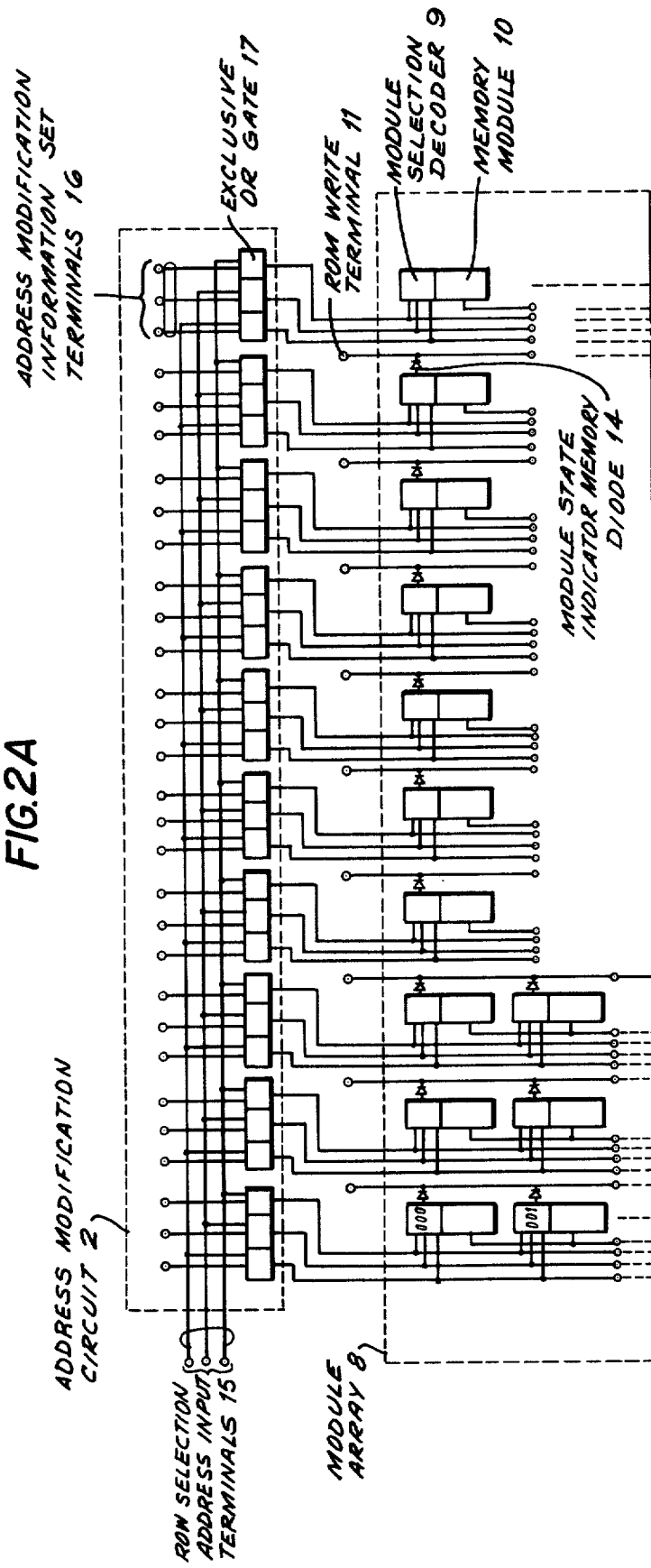
FIGS. 2A and 2B, which together form a single FIG., are a detailed block diagram of another embodiment of the memory apparatus of the invention.
Figure 2B:
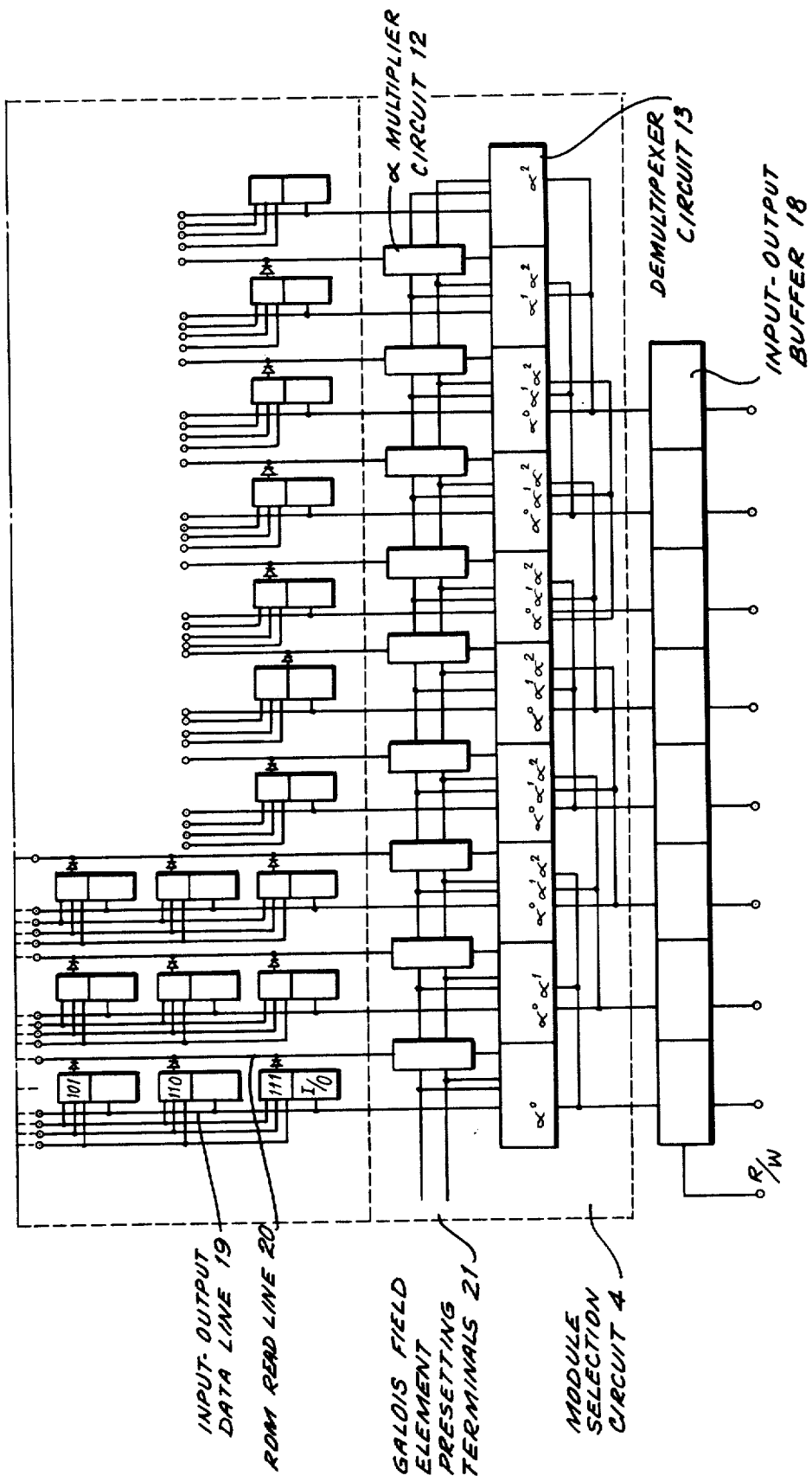

FIGS. 2A and 2B, which together form a single FIG., show an embodiment of the memory apparatus of the invention. FIGS. 2A and 2B show a circuit diagram of a module array of 8 rows and 10 columns. FIGS. 2A and 2B include the address modification circuit 2, the module selection circuit 4, the module array 8 including the module state indicator and a module selection decoder 9. The memory apparatus of FIGS. 2A and 2B further include a memory module 10, a Read Only Memory or ROM write terminal 11, an $\alpha$ multiplier circuit 12, a demultiplexer circuit 13, a diode element 14 functioning as the state indicator memory and row selection address input terminals 15. FIGS. 2A and 2B also include address modification information set terminals 16, an Exclusive OR or EOR gate 17, an input-output buffer 18, an input-output data line 19, a ROM read line 20 and terminals 21 for presetting the Galois field element GF $(2^2)$.

In the illustrated example, the actually required module is $8 \times 8$ and the spare module is $8 \times 2$. In FIGS. 2A and 2B, the address wiring for selecting a storage cell in each module is omitted, and only the address wiring for selecting one of eight modules is indicated for each column. Furthermore, in FIGS. 2A and 2B, the read and write lines of each module are indicated in common by one input-output data line 19 for simplification. It is, of course, possible to individually illustrate the input and output lines, respectively, in multi-bit configuration.

The module state indicator of FIGS. 2A and 2B is built in the module array. A diode 14 functions as a one bit ROM, which operates as the module state indicator memory, to which access is made simultaneously by the module selection decoder 9 for each module. It is, of course, possible to arrange the module state indicator outside the module array concentration, as shown in FIG. 1.

Furthermore, in FIGS. 2A and 2B, the indicators are not provided in the module column at the extreme right end. This is because when the $\alpha$ multiplier circuit indicates that the extreme right module is selected, if this module is defective, the wafer of which it is a part may no longer be used.

The address modification circuit 2 results are provided in the exclusive OR or EOR gate 17 from the address signal input via the three row selection address input terminals or a bus 15 and modify information previously set by the three address modification information set terminals 16 for each row.

The module selection circuit 4 places the data from a defective module in the non-selection condition, upon being given the information of defectiveness from the module state indicator. When the information of good is provided, the data is placed in the selection condition and connects it to the input-output buffer 18. This function is described hereinafter.

A wafer memory having the aforedescribed configuration is subject to a test for the module array 8 at the time of completion of the manufacturing process. At such time, all the address modification information set terminals 16 of each column are set to "0". In addition, when the main module array is tested, $\alpha^0$ is set at the Galois field GF $(2^2)$ element presetting terminals 21, and $\alpha^2$ is set when the spare module array is tested. All the memory modules may be tested by the aforedescribed operations from the outside, without additional operations, and with the same condition as that for actually using the memory module. That is, test pads and complicated exclusive control circuitry are not required.

Thus, testing is carried out for all the modules by the aforedescribed method, and programming is performed for the ROM provided for each module in accordance with the results of such testing. As an example of the method of this programming, the module corresponding to ROM14 in which "1" is written is selected by means of the address, and a specified voltage is applied to the ROM write terminal 11 of the relevant column. This results in the diode 14 being burned out.

"1" is assumed to be programmed when defective information is provided. It is also considered that there are 16 defective modules which are equal in number to the spare memory modules. FIG. 3A is an example of the distribution of the defective modules in this case. FIG. 3A corresponds to the memory module array of 8 rows and 10 columns shown in FIGS. 2A and 2B. The three bits in the left column of each row are the row selection address 15 and the three bits at the top of each column are the address modification information 16.

In the example of FIG. 3A, defective modules are concentrated at the row addresses (000) and (001), so that the necessary 8 modules are not provided for these rows. Thus, by performing address modification for each row, the defective modules are dispersed. The replacement of two defective modules in the third and fourth columns from the left is considered, for example. When (010) is set as the address modification information for the modules in the third column, the given addresses (000) and (001) are modified into (010) and (011) by obtaining an EOR condition between the row address information provided from outside the array and the information set. Finally, the modules at the addresses (000) and (001) are selected when the addresses (010) and (011) are provided from outside the array. In terms of equivalency, this means, when viewed from outside, that the defective modules at the addresses (000) and (001) are replaced to the addresses (010) and (011). Similarly, it is also possible to replace 16 defective modules, so that there are always 8 good modules in 10, selected simultaneously with adequate modification for any address. An example of this is shown in FIG. 3B.

In the condition of FIG. 3B, when it is supposed that access is made to the address (010), the ROM pattern read out at such time is (0011000000). The ROM read out is input to the $\alpha$ multiplier circuit 12 and the demultiplexer circuit 13 of the module selection circuit 4 after passing the ROM read out line 20.

The address modification information in the address modification information set terminals 16 may be provided in the form of a ROM by cutting the diode, as in the case of the module state indicators, or by being written into a series shift register having the necessary number of bits, each connected to the terminals 16. In this example, there are 3 by 10, or 30 bits.

FIG. 4A illustrates another distribution example including 16 defective modules in the array and FIG. 4B shows the equivalent arrangement of defective modules after the address modification. Since FIGS. 4A and 4B are interpreted in the same manner as FIGS. 3A and 3B, explanation is omitted.

Figure 5A:
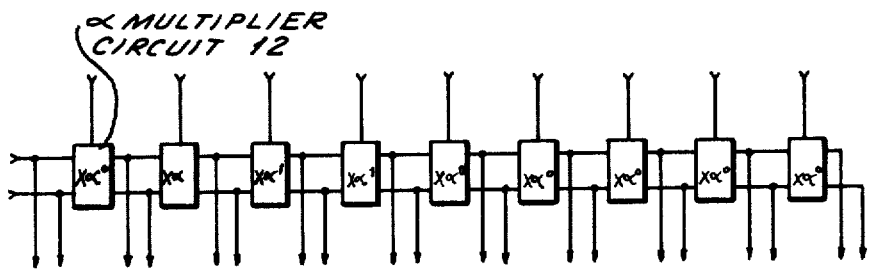
FIG. 5A is a block diagram of an embodiment of the module selection circuit of the memory apparatus of the invention.
Figure 5B:
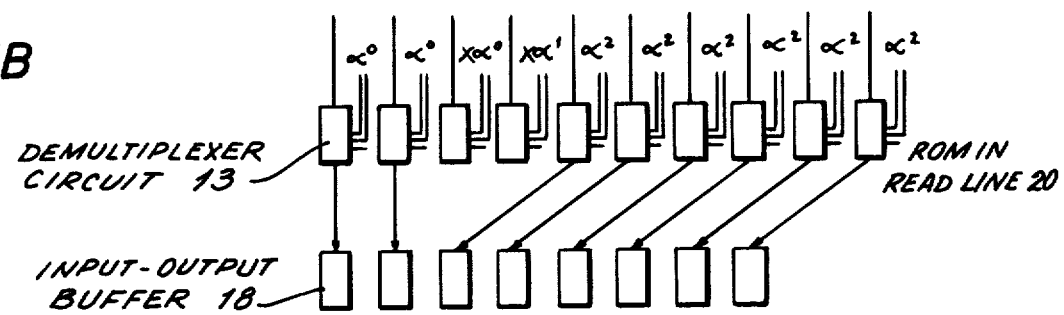
FIG. 5B is a block diagram of another embodiment of the module selection circuit of the memory apparatus of the invention.

FIGS. 5A and 5B are block diagrams of the embodiment of the module selection circuit of the memory apparatus of the invention. As shown in FIG. 5A, the module selection circuit comprises a plurality of $\alpha$ multiplier circuits. In the embodiment of FIG. 5B, the module selection circuit comprises a plurality of demultiplexer circuits 13 and a plurality of input-output buffers 18 connected to the outputs of the demultiplexer circuits.

Figure 6:
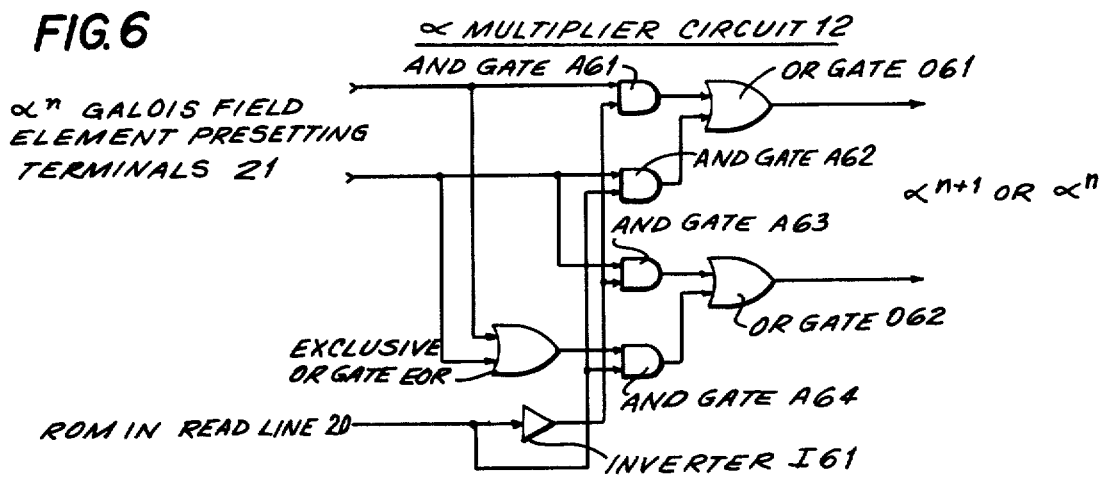
FIG. 6 is a block diagram of an embodiment of the $\alpha$ multiplier circuit of the memory apparatus of the invention.

FIG. 6 shows an embodiment of the $\alpha$ multiplier circuit 12 of the memory apparatus of the invention. In the embodiment of FIG. 6, $\alpha$ is the primitive element of the Galois field element GF($2^2$). The $\alpha$ multiplier circuit 12 provides an output by multiplying $\alpha$ by the input in accordance with the information "1" or "0" from the ROM. That is, when "1", which indicates a defective module, appears, an output is provided. An output is provided without the aforedescribed multiplication when "0", which indicates a good module, appears. The demultiplexer circuit 13 in the next stage switches the line by using $\alpha^0$, $\alpha^1$, $\alpha^2$, which may be obtained as a result of the arithmetic operation of the $\alpha$ multiplier circuit 12 as the switching information. Thus, for example, when access is made to the row address (010) by the module array and each bit of the pattern information (0011000000) from the ROM is respectively input to the $\alpha$ multiplier circuit 12, $\alpha^0$, which is set at the preset terminal 21 of the Galois field GF($2^2$), is multiplied by $\alpha^0$ or 1, or is multiplied by $\alpha$ or $\alpha$, whereby any of $\alpha^0$, $\alpha^1$ and $\alpha^2$ is provided as the output, as shown in FIG. 5A. When $\alpha^0$ is input to the control terminal, the demultiplexer circuit 13 connects the input-output terminal 19 of the module and the $\alpha^0$ output terminal of FIGS. 2A and 2B. When $\alpha^1$ is input it connects the module input-output terminal and the $\alpha^1$ output terminal. When $\alpha^2$ is input, it connects the module input-output terminal and the $\alpha^2$ output terminal.

The aforedescribed connecting operation is carried out only when the read out ROM information ROMIN is "0", however. Otherwise, the input-output terminal of the module is not connected to any output. The $\alpha$ multiplier circuit 12 comprises, for example, the logic circuits shown in FIG. 6. These logic circuits include first, second, third and fourth AND gates A61, A62, A63 and A64. The first AND gate A61 has a first input connected to one of the Galois field element presetting terminals 21 and the fourth AND gate A64 has a first input connected to said one of said terminals via an input of an exclusive OR gate EOR61. The second AND gate A62 has a first input connected to the other of the GALOIS field element presetting terminals 21, to a first input of the third AND gate A63 and the other input of the exclusive OR gate EOR61 is connected to the other of said terminals.

The read out ROM information ROMIN is supplied, via the ROMIN read line 20, to a second input of the second AND gate A62 and a second input of the fourth AND gate A64 and is supplied to a second input of the first AND gate A61 via an inverter I1 and to a second input of the third AND gate A63 via said inverter. The first AND gate A61 has an output connected to an input of an OR gate O61. The second AND gate A62 has an output connected to another input of the OR gate O61. The OR gate O61 has an output which is an output of the circuit. The third AND gate A63 has an output connected to an input of an OR gate O62. The fourth AND gate A64 has an output connected to another input of the OR gate O62. The OR gate O62 has an output which is an output of the circuit.

In the $\alpha$ multiplier circuit of FIG. 6, $\alpha^n$ is the input at the Galois field element presetting terminals 21 and ROMIN is an input from the memory state indicator. When the Galois field element is indicated by vector, $\alpha^0$ may be expressed as (1,0), $\alpha^1$ may be expressed as (0,1) and $\alpha^2$ may be expressed as (1,1).

It is assumed that $\alpha^0$ or (1,0) is set at the present input and ROMIN is "0" or a good module. $\alpha^0$ or (1,0) may then be obtained at the output side. When connection is established so that the output $\alpha^0$ or $\alpha^1$ of the $\alpha$ multiplier circuit of FIG. 6 is sequentially input to the nine $\alpha$ multiplier circuits 12 of FIG. 5A, each output $\alpha^0$, $\alpha^1$ and $\alpha^2$, shown in FIG. 5A, may be obtained.

Since the terminals $\alpha^0$, $\alpha^1$, $\alpha^2$ of the demultiplexer circuit 13 and the input-output buffer 18 are connected by the lines shown in FIGS. 2A and 2B, ten modules corresponding to the address (010) viewed from outside are connected to said input-output buffer circuit, as shown in FIG. 5B. In this case, the period from the readout of information from the ROM to the completion of the aforedescribed switching operation naturally becomes a problem. However, it is carried out in parallel with the operation of the memory module and therefore it is not a problem so long as the ROM readout time is shorter than the access time of the individual memory module.

If access is made to ten modules in the other addresses, the aforedescribed operation is also carried out and they can be used from the outside as a completely good 8 × 8 module array.

The $\alpha$ multiplier circuit 12 of FIG. 6 is used in FIGS. 2A and 2B as the module selection circuit 4, but it may be replaced with an adder circuit or +1 circuit. More particularly, when the number of main modules and spare modules are increased, respectively, the number of circuits does not increase as much, even if the number of bits increases. The circuit configuration is thus simple, due to the use of the $\alpha$ multiplier circuit 12 and the Galois field element for the control of the demultiplexer 13. This is an advantage of the apparatus and method.

When fewer modules are used, the circuit configuration rather becomes simple due to the use of the adder or +1 circuit and ordinary binary information. The use of an adder or +1 circuit is hereinafter explained. The adder or +1 circuit is shown in FIG. 7. When a "0" input is provided at the ROM information input terminal ROMIN, the adder circuit provides the 2-bits of the switching circuit or demultiplexer control information provided at the input terminals IN directly at the output terminals OUT. When a "1" input is provided at the ROM information input terminal ROMIN, the adder circuit provides the 2-bits information plus 1 at the output terminals OUT.

In the adder circuit of FIG. 7, the input IN has a pair of input terminals 71A and 71B and the output OUT has a pair of output terminals 72A and 72B. The ROM information input ROMIN is provided at a terminal 73 and is supplied directly to an input of a first adder 74A and to an input of an AND gate A75. The AND gate A75 has an output connected to an input of a second adder 74B. The input terminal 71A is connected directly to the other input of the first adder 74A and to the other input of the AND gate A75. The input terminal 71B is connected directly to the other input of the second adder 74B.

In the aforedescribed case, the switching circuit or demultiplexer 13 is the same as the circuit shown in FIG. 2 from the point of view of its function. Actually, however, there is a small difference between them. In FIG. 2, $a^o$ (1,0), $a^1$ (0,1) and $a^2$ (1,1) are used as the switching information. However, ordinary binary information (00), (10), (01) is used in the demultiplexer circuit 13 of FIG. 8. Therefore, when 0011000000 is read out from the ROM, as in FIG. 5A, a setting is made as shown in FIG. 9, so that the demultiplexer 13 performs the same connecting operation as in the FIG. 5B.

In an example of the state of FIG. 2, 1 bit is used per module for the module state indicator, and switching is performed in one module unit. However, it is also possible to perform switching in units of ¼ module, however, by using 4-bits for each module. In this case, even when the same condition as when the case module is not divided is provided for address modification, six defective modules in a row may still be saved, as shown in FIG. 10, by dividingly executing the switching in units of ¼ module.

Figure 10:
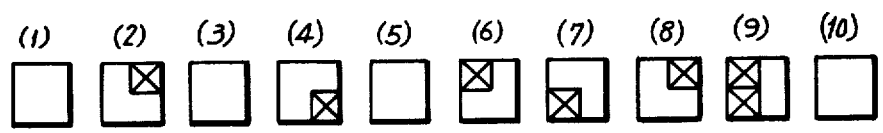
FIG. 10 is an illustration of the distribution of defective modules.

When the consideration is in units of one module, six modules (2), (4), (6), (7), (8) and (9) are defective in the example of FIG. 10. When the consideration is in units of ¼ module, considered at the upper right of each module, for example, only the modules (2) and (8) are defective.

Similarly, there are only one or two defective modules in the example of FIG. 10 when the consideration is the ¼ module of the upper left, lower right, and lower left of each module. The memory apparatus of the invention therefore permits a saving to be made in the example of FIG. 10.

Figure 11:
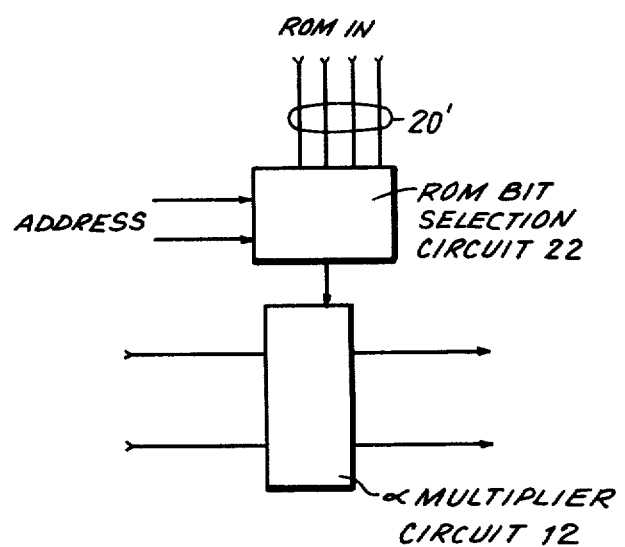
FIG. 11 is a block diagram of still another embodiment of the $\alpha$ multiplier or adder circuit of the memory apparatus of the invention.

In this case, it is sufficient to modify the $\alpha$ multiplier circuit or the adder or +1 circuit, as shown in FIG. 11. The ROM information ROMIN of 4 bits from each module is provided via terminals 20' to an ROM bit selection circuit 22. Only one bit of 4 bits is selected by means of the address for selecting ¼ module. The selected 1 bit ROM information ROMIN is supplied to the $\alpha$ multiplier circuit 12, which is identical to the $\alpha$ multiplier circuit of FIG. 6 or the adder or +1 circuit of FIG. 7.

As hereinbefore explained, desired defective modules may be switched to almost the desired spare modules by the memory apparatus of the invention without deterioration of access time and without the provision of a special circuit in the module array. When a wafer memory is realized, therefore, the module application efficiency is improved, and the yield is simultaneously improved outstandingly.

Figure 12:
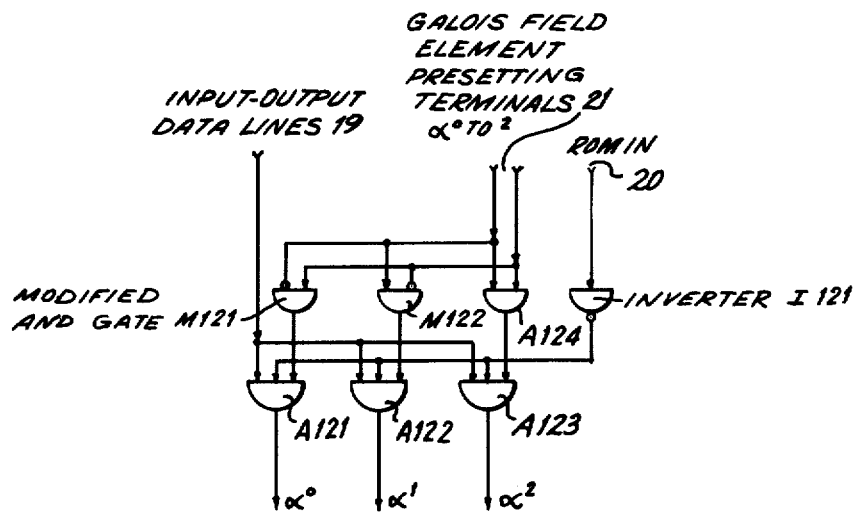
FIG. 12 is a block diagram of an embodiment of the demultiplexer circuit of the module selection circuit of FIG. 5B.

FIG. 12 is a block diagram of an embodiment of the demultiplexer circuit of the module selection circuit of FIG. 5B. In the embodiment of FIG. 12, the input-output data lines 19 are connected to a first input of each of three AND gates A121, A122 and A123. The ROM information ROMIN is supplied to a second input of each of the AND gates A121, A122 and A123 via the input terminal 20 and an inverter gate I121 (o represents an inverter). The Galois field element vectors $\alpha^0$, $\alpha^1$ and $\alpha^2$ are supplied via the Galois field element presetting terminals 21 to first inputs and second inputs of a pair of modified AND gates M121 and M122 and to first and second inputs of an AND gate A124. The outputs of the modified AND gate M121, the modified AND gate M122 and the AND gate A124 are connected to a third input of each of the AND gates A121, A122 and A123, respectively. Each of the AND gates A121, A122 and A123 has an output, and these outputs provide the outputs $\alpha^0$, $\alpha^1$ and $\alpha^2$ of the circuit.

Figure 13:
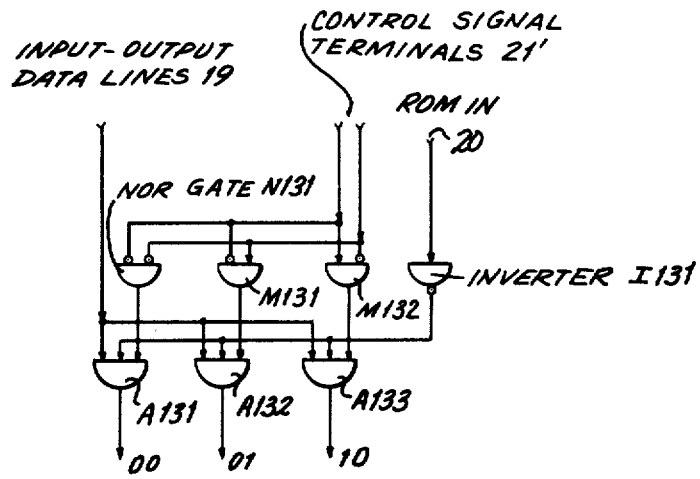
FIG. 13 is a block diagram of an embodiment of the demultiplexer circuit of FIG. 8.

FIG. 13 is a block diagram of an embodiment of the demultiplexer circuit of the demultiplexer circuit of FIG. 8. In the embodiment of FIG. 13, the input-output data lines 19 are connected to a first input of each of three AND gates A131, A132 and A133. The ROM information ROMIN is supplied to a second input of each of the AND gates A131, A132 and A133 via the input terminal 20 and an inverter gate I131. The binary signal is supplied via the control signal terminals 21' to first and second inputs of the modified AND gates M131, M132 and the NOR gate N131. The outputs of the modified AND gates M131 M132 and the NOR gate N131 are connected to a third input of each of the AND gates A131, A132 and A133, respectively,. Each of the AND gates A131, A132 and A133 has an output, and these outputs provide the outputs 00, 01 and 10 of the circuit. In FIGS. 12 and 13 only circuits for reading out are disclosed. However, it is apparent that circuits for writing in can be similarly composed by the man skilled in this art.

While the invention has been described by means of specific examples and in specific embodiments, we do not wish to be limited thereto, for obvious modifications will occur to those skilled in the art without departing from the spirit and scope of the invention.

We claim:

1. Memory apparatus, comprising
    a module array having a plurality of memory modules, each having at least one memory cell, arranged in a matrix of $m$ rows and $n$ columns;
    address input means for providing row addresses for each column of the array from outside said memory apparatus;
    address modification means for each column of the module array for modifying the row addresses provided for each column of the array to provide new addresses;
    address decoding means in the array connected to the address modification means for selecting the modules of each column of the array, one by one, in accordance with the new addresses;

module state indicator means in the array connected to the address decoding means and having memory means of at least one bit corresponding to each module of all the rows and all the columns of the array, except one border column, for indicating the good or defective condition of each module when accessed at the time the module is accessed;

module selection means connected to the module state indicator means and to the array for selecting only a specified number of good modules from $n$ modules accessed simultaneously according to the indication of the module state indicator; and input-output means connected by the module selection means to the good modules selected by the module selection means.

2. Memory apparatus as claimed in claim 1, wherein the module selection means comprises $\alpha$ multiplier circuit means connected in series with each other and connected to the module state indicator means of each column of the array for providing for each column of the array an output directly corresponding to a Galois field element $\alpha^i$ supplied from the next-preceding stage when the indication of the module state indicator is for a good module and an output corresponding to a Galois field element $\alpha^{i+1}$ when the indication of the module state indicator is for a defective module, and demultiplexer circuit means connected to each column of the array and to the $\alpha$ multiplier circuit means for controlling the connection of an accessed module in a column of the array to the input-output means in accordance with the output of the $\alpha$ multiplier circuit means corresponding to the column and indication of the module state indicator.

3. Memory apparatus as claimed in claim 1, wherein the module selection means comprises adder circuit means connected in series with each other and connected to the module state indicator means of each column of the array for providing for each column of the array an output directly corresponding to the binary value supplied from the next-preceding stage when the indication of the module state indicator is for a good module and an output corresponding to said binary value plus $+1$ when the indication of the module state indicator is for a defective module, and demultiplexer circuit means connected to each column of the array and to the adder circuit means for controlling the connection of an accessed module in a column of the array and to the input-output means in accordance with the output of the adder circuit means corresponding to the column and indication of the module state indicator.

4. Memory apparatus as claimed in claim 3, further comprising control means for controlling the module selection means to select good modules in accordance with a selected part of each memory module.

5. Memory apparatus as claimed in claim 4, wherein the selected part of each memory module controlled by the control means is the whole module.

6. Memory apparatus as claimed in claim 4, wherein the selected part of each memory module controlled by the control means is a fraction of the module.

7. Memory apparatus as claimed in claim 1, further comprising a sheet of a semiconductor wafer, and wherein the module array is provided on said sheet.

8. Memory apparatus as claimed in claim 1, further comprising a plurality of read only memory lines each having an input end with a read only memory write terminal connected thereto and an output end connected to the module selection means, and connected to the module state indicator means of a corresponding one of the columns of the array.

* * * * *